(12) United States Patent
Morey et al.

(10) Patent No.: US 9,763,321 B2
(45) Date of Patent: Sep. 12, 2017

(54) MULTI-LAYERED ELECTRONIC SYSTEM

(71) Applicant: Johnson Electric S.A., Murten (CH)

(72) Inventors: Alan Roger Morey, Shanklin (GB); Martin Wallace Edmonds, East Cowes (GB); Gregory Tobias Knight, Ryde (GB); Alex James Cowcher, Sandown (GB); Paul Alfred Hilson, Sandown (GB); Steven Mark Smith, Ryde (GB)

(73) Assignee: JOHNSON ELECTRIC S.A., Murten (CH)

( * ) Notice: Subject to any disclaimer, the term of this patent is extended or adjusted under 35 U.S.C. 154(b) by 13 days.

(21) Appl. No.: 14/643,661

(22) Filed: Mar. 10, 2015

(65) Prior Publication Data
US 2015/0257259 A1  Sep. 10, 2015

(30) Foreign Application Priority Data
Mar. 10, 2014 (GB) .................... 1404188.3

(51) Int. Cl.
*H05K 7/00* (2006.01)
*H05K 1/02* (2006.01)
*H05K 1/18* (2006.01)

(52) U.S. Cl.
CPC ........... *H05K 1/0275* (2013.01); *H05K 1/181* (2013.01); *H05K 2201/09263* (2013.01)

(58) Field of Classification Search
USPC .................................. 361/761; 174/520, 251
See application file for complete search history.

(56) References Cited

U.S. PATENT DOCUMENTS

| 7,015,823 B1 | 3/2006 | Gillen et al. |
| 2010/0026336 A1* | 2/2010 | Bartley .................... G06F 21/75 326/8 |
| 2010/0245112 A1* | 9/2010 | Ludwig ..................... G09F 9/30 235/492 |
| 2014/0049887 A1 | 2/2014 | Salle |

FOREIGN PATENT DOCUMENTS

| GB | 2505176 A1 | 2/2014 |
| JP | 2001-196704 | 7/2001 |

* cited by examiner

*Primary Examiner* — Andargie M Aychillhum
(74) *Attorney, Agent, or Firm* — Muncy, Geissler, Olds & Lowe, P.C.

(57) ABSTRACT

A multi-layered electronic system has a support substrate including at least a primary conductive track; a security layer including at least a conductive security track; an electrically-conductive engagement element in electrical communication with the primary conductive tack, and to which the security layer is mounted so that the conductive security track is in permanent electrical communication with the primary conductive track; and a flexible cover layer which overlies the security layer and which is directly or indirectly secured to the support substrate. The electrical connection between the security layer, conductive engagement element and primary conductive track is interrupted when the conductive security track is broken.

21 Claims, 3 Drawing Sheets ary and security circuits upon moving the spigot, thereby ensuring that the circuit is completed successfully. However, it can be difficult to create sufficient force with the housing

MULTI-LAYERED ELECTRONIC SYSTEM

CROSS REFERENCE TO RELATED APPLICATIONS

This non-provisional patent application claims priority under 35 U.S.C. §119(a) from Patent Application No. GB1404188.3 filed in The United Kingdom on Mar. 10, 2014, the entire contents of which are hereby incorporated by reference.

FIELD OF THE INVENTION

The present invention relates to a multi-layered electronic system having a primary conductive track in permanent electrical connection with a conductive security track. The invention further relates to an anti-tamper electronic device utilising such a system, and to a method of deactivating such a device if tampered with.

BACKGROUND OF THE INVENTION

There are many electronic systems for which it is highly undesirable to permit tampering with the circuitry. For instance, any device relating to the security of financial transactions is vulnerable if the circuitry can be tampered with. A bank card reader, for example, could thus be backed or otherwise compromised to bypass the security and used for criminal purposes.

Many such devices have therefore been created which involve a security circuit, a circuit which is easily broken when tampered with which permanently deactivates the device. Typically the security circuit will take the form of a flexible or deformable layer having conductive tracks on a lower surface which can be lain over the primary circuit. The conductive tracks can be actuated into electrical contact with the primary circuit, thereby completing the circuit. If the device is tampered with, the flexible layer will break, destroying the security circuit, and breaking the connections of the primary circuit.

In the case of a bank card reader, there is a security circuit which covers switching domes. When a keypad button is depressed, the security circuit deforms collapsing the switching dome, shorting together switch contacts on the PCB, located under the centre of the dome and around the outer edge of the dome.

Similar security domes are provided to electrically connect the security circuit to the primary circuit. These domes are held in the operated condition by movable spigots associated with the housing, when the housing is in the closed condition. Opening of the housing moves at least one of these spigots, releasing the associate dome, thereby triggering an alarm condition. This allows a transaction to progress, safe in the knowledge that no third party has interfered with the reader.

However, this system clearly only works if there are movable spigots present in the electronic device. It may be desirable to integrate security circuits into a great range of devices to prove that they have not been tampered with. To be effective, the security circuit must be in permanent electrical connection with the primary circuit.

Unfortunately, the main advantage associated with the spigot-based engagement means is that a strong connecting force is applied between the conductive tracks of the primary and security circuits upon moving the spigot, thereby ensuring that the circuit is completed successfully. However, it can be difficult to create sufficient force with the housing to close all security domes. A dome typically requires 100 to 150 grams of activation force, and pushing four to six security domes in a normal transaction device can often be too much for a standard housing to cope.

SUMMARY OF THE INVENTION

The present invention seeks to provide solutions to the afore-mentioned problems by providing a multi-layered electronic system, wherein a suitable engagement means between the security and primary circuits is provided.

According to a first aspect of the invention, there is provided a multi-layered electronic system comprising a support substrate including at least a primary conductive track; a security layer including at least a conductive security track; an electrically-conductive engagement element in electrical communication with the primary conductive track, and to which the security layer is mounted so that the conductive security track is in permanent electrical communication with the primary conductive track; and a flexible cover layer which overlies the security layer and which is directly or indirectly secured to the support substrate wherein the electrical connection between the security layer, conductive engagement element and primary conductive track is interrupted when the conductive security track is broken.

By forming a permanent electrical connection between the security track and the primary conductive track, security circuits can be more widely utilised and integrated into a greater variety of products which might benefit from anti-tamper capabilities. Up to now, there has been great difficulty in providing adequate electrical connections between the primary and security conductive tracks without the provision of an external force, for instance, that provided by a spigot. This has now been solved by the provision of the electrically-conductive engagement element in conjunction with the cover layer which puts the multi-layered construction into compression.

Preferably the conductive engagement element is formed from a non-deformable material, thereby providing a tension to the flexible cover layer for retaining the security layer against the conductive engagement element.

The major problem with existing security circuits is the requirement for a spigot or other device to provide a force to maintain the physical and electrical communication between the security layer and the support substrate. By providing a non-deformable conductive engagement element which protrudes from the surface of the support substrate, the flexible cover layer can be secured under tension to the support substrate. This will provide a sufficient force to keep the security circuit securely in electrical contact with the support substrate.

Preferably, the conductive engagement element may be any of: an electrical component or device, such as a resister, capacitor or diode, secured to the support substrate; a solder bump; an electrically-conductive foam; or an electrically-conductive adhesive.

The electrically-conductive engagement element may take many forms. The advantage of the conductive engagement element is that the security layer is securely affixed to the support substrate, so that electrical communication is permanently maintained in normal use between the primary and security conductive tracks.

Preferably, the conductive security track follows a meandering, tortuous or zig-zagged path. The security layer may be integrally formed with the flexible cover layer and if so, the conductive security track may advantageously cover a majority of a lower surface of the flexible cover layer.

The aim of the security circuit is to prevent illicit tampering with the electronic system. By shaping the conductive security track to cover a large, randomised area, a criminal cannot knowingly bypass the security layer of the system without risking permanent deactivation of the device by breaking the security track.

Preferably, the support substrate is a printed circuit board. The flexible cover layer may also beneficially be directly secured to the support substrate using an adhesive. Ideally, the primary and security tracks are formed from a highly electrically-conductive material, and this is preferably copper, nickel, gold, silver, other precious noble metal, or any suitable electrically conductive material. Conveniently, printed electronics technology can be utilised for the conductors, and/or flexible printed circuit technology, both of which are well defined understood terms in their respective fields.

Printed circuit boards offer an easily manufactured support for a primary conductive track, in addition to a flat surface onto which the flexible cover layer may be adhered. The printed circuit board is preferably rigid or substantially rigid, but it may also be a flexible substrate, as necessity dictates. A benefit therefore of the flexible cover layer is that the interposed layers are held in resilient permanent compression, irrespective of the rigidity of the mounting substrate.

Preferably, the electronic system may further comprise a retaining element overlying the flexible cover layer directly above the conductive engagement element, the retaining element applying a retaining force towards the support substrate to reinforce the compressive physical and electrical connection between the security layer, the conductive engagement element and the support substrate. This retaining element may preferably be a spigot.

To further enhance the physical and electrical connection between the security circuit, the conductive engagement element and the primary circuit, a spigot can be utilised. This advantageously applies a downward pressure onto the flexible cover layer, compressing the layers together towards the support substrate. This further prevents dislocation of the security layer, preventing accidental breakages of the security circuit and thus increasing device robustness and longevity.

According to a second aspect of the invention, there is provided an anti-tamper electronic device, wherein the circuitry of the device includes a multi-layered electronic system in accordance with the first aspect of the invention. Preferably, the flexible cover layer may be connected to a case or housing of the electronic device.

According to a third aspect of the invention, there is provided a method of deactivating an anti-tamper electronic device according to the second aspect of the invention, comprising the steps of a] tampering with a case or housing of the device; and b] resultantly damaging the flexible cover layer of the multi-layer electronic system due to the tampering, thereby breaking the conductive security track and therefore electronic circuit, deactivating the device.

A device being provided with a multi-layered electronic system allows for deactivation of the device when the security circuit is broken, in other words, when it is tampered with. This feature may be advantageous for a variety of devices. Furthermore, if the flexible cover layer is affixed to a housing of the electronic device, then dismantling the device will destroy the circuit, providing a further layer of protection against tampering.

BRIEF DESCRIPTION OF THE DRAWINGS

A preferred embodiment of the invention will now be described, by way of example only, with reference to figures of the accompanying drawings. In the figures, identical structures, elements or parts that appear in more than one figure are generally labeled with a same reference numeral in all the figures in which they appear. Dimensions of components and features shown in the figures are generally chosen for convenience and clarity of presentation and are not necessarily shown to scale. The figures are listed below.

DETAILED DESCRIPTION OF THE PREFERRED EMBODIMENTS

Figure 1:
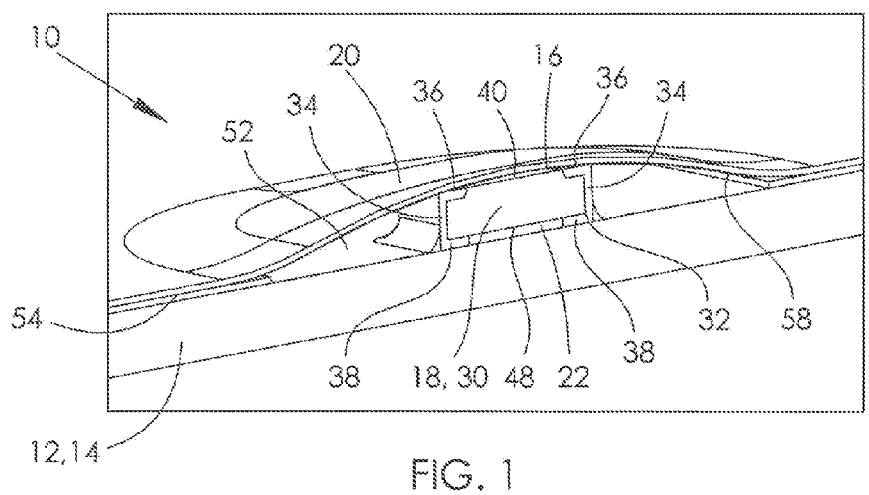
FIG. 1 is a side perspective cross-sectional view of a first embodiment of a multi-layered electronic system, in accordance with the first aspect of the present invention.
Figure 2:
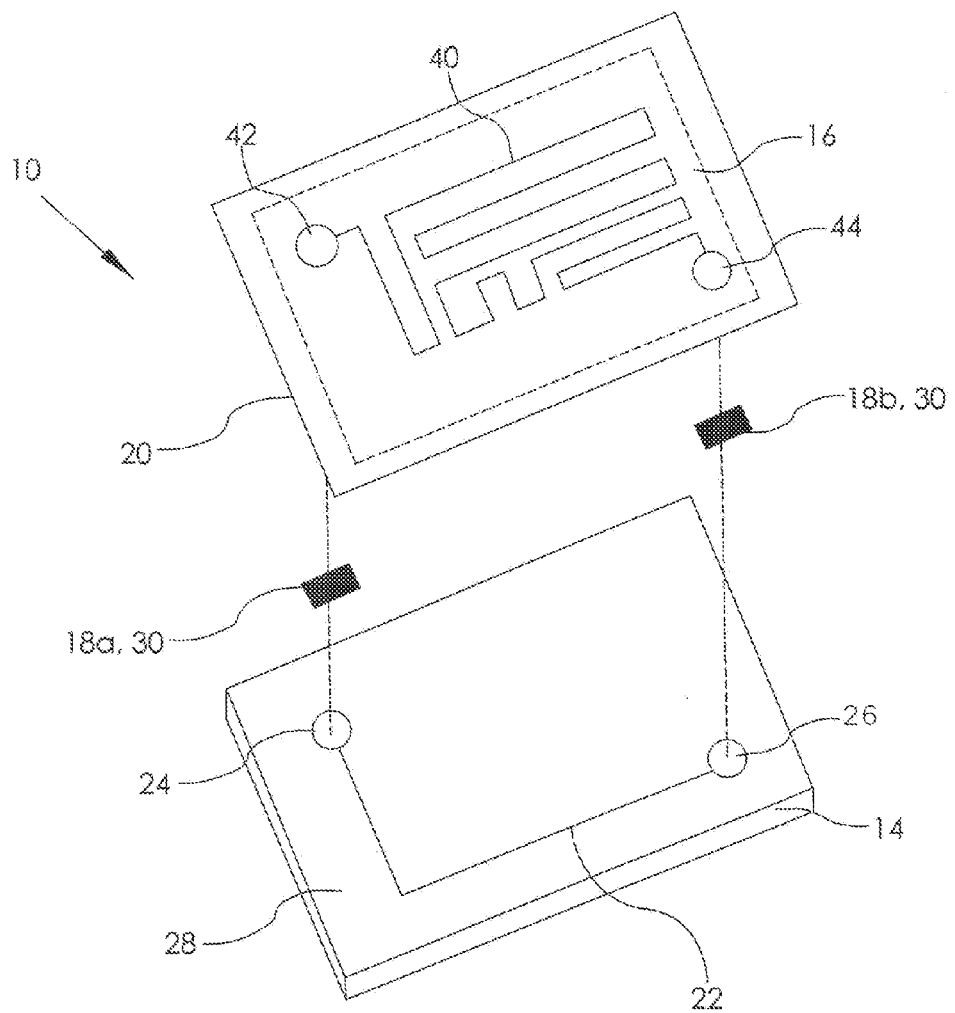
FIG. 2 is an exploded perspective representation of the multi-layered electronic system of FIG. 1.
Figure 3A:
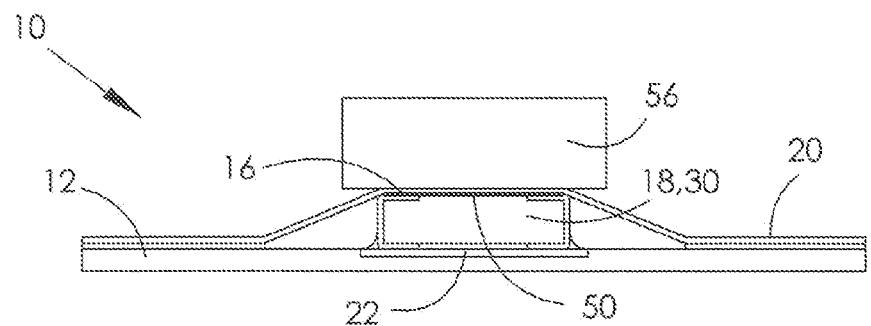
FIG. 3a is a side cross-sectional view of the first embodiment of the multi-layered electronic system of FIG. 1.

Referring firstly to FIGS. 1, 2 and 3a, there is shown a first embodiment of a multi-layered electronic system 10 comprising a support substrate 12, in this case a printed circuit board (PCB) 14, a, preferably flexible, security layer 16, an electrically-conductive engagement element 18, and a flexible cover layer 20.

The PCB 14 includes at least one primary conductive track 22, basically represented for clarity in FIG. 2 by way of example only, the track 22 terminating at one end with a first primary terminal 24 and in a second primary terminal 26 at the opposing end. A first said electrically-conductive engagement element 18a is attached to the first primary terminal 24, and a further said electrically-conductive engagement element 18b is connected to the second primary terminal 26. The circuitry of the PCB 14 is the functional circuitry, and is referred to as the primary circuit 28.

In this first embodiment, each electrically-conductive engagement element 18a, 18b is a cuboidal resistor 30 affixed to the PCB 14 using a resistor engagement means 32. The resister engagement means 32 comprises two upstanding walls or legs 34 having or forming an overhang 36 along its top edge, and a corresponding turned in extension 38 along its lower edge. Each wall 34 is soldered to or otherwise engaged with the PCB 14, so as to be in electrical communication with the primary track 22. The resistor may be a of the surface mount type. Alternatively, with suitable arrangements in the alarm detection circuit, the engagement element may be another type of electrical component, such as a capacitor or a diode.

The security layer 16 comprises at least one conductive security track 40 following a meandering, or tortuous path from a first security terminal 42 to a second security terminal 44. Each security terminal 42, 44 is paired with a corresponding primary terminal 24, 26, the associated terminals 24, 42, 26, 44 being interconnected by a respective resistor 30. Typically the conductive security track 40 will be formed from copper, nickel, gold, silver, other precious noble metal or a similarly highly electrically-conductive material. Printed electronics technology and/or flexible printed circuit technology can be considered, whereby a suitably electrically-conductive material can selected and utilised. The circuitry of the security layer is merely for connective purposes, and is referred to subsequently as the security circuit 46.

A lower face 48 of each resistor 30 is therefore in both physical and electrical communication with the primary conductive track 22, and an upper face 50 of the resistor 30 is in physical and electrical communication with the conductive security track 40. The primary conductive track 22, resistors 30 and secondary conductive track 40 thus form a complete electrical circuit.

To retain the security layer 16 against the PCB 14, the flexible cover layer 20 is lain over the security layer 16, and subsequently adhered to an upper surface 52 of the PCB 14 using a cover attachment adhesive 54. The flexible cover layer 20 is stretched over the entire PCB 14, thus providing a tension to keep the security layer 16 in situ in compressive communication with the resistors 30.

To add further support to the retention of the security layer 16 atop the electrically-conductive engagement element 18, the electronic system 10 may be further provided with a spigot 56 which further compresses the layers together. The spigot 56 may for instance be attached to a back or underside of a bank card reader, or may be an integral part or intermediate layer of or associated with a housing for an electronic device utilising the system 10.

When assembled, there at least four distinct layers to the system 10. Proceeding upwardly, these are: the PCB 14; the resistor 30; the security layer 16; and the flexible cover layer 20. Typically, the security layer 16 will be provided integrally with the flexible cover layer 20, being formed as a mesh which will be printed onto, bonded using adhesive, or cross-link bonded via sputtering with the flexible cover layer 20.

In use, the conductive security track 40 of the security layer 16 will form a full circuit with the primary conductive track 22 of the PCB 14 after engagement of the respective primary and security tracks terminals 24, 42, 26, 44. Breaking the security track 40 will therefore disable the entire circuit. Since the conductive security track 40 is provided attached to the flexible cover layer 20, breaking or damaging the flexible cover layer 20 will simultaneously break the conductive security track 40.

To tamper with the primary conductive track 22 in order to make changes to the operation of the main circuitry, and therefore operation of any device utilising the system 10, the flexible cover layer 20 must be removed. Since the flexible cover layer 20 is adhesively connected to the PCB 14, attempting to peel the flexible cover layer 20 from the PCB 14 will result in damage to the security track 40. The flexible cover layer 20 may be further connected to a housing of an electrical device utilising the electronic system 10, such that when the housing is removed, cracked, split or opened in any unauthorised or unconventional way, the flexible cover layer 20 is automatically torn or damaged, resulting in damage to the security track 40.

Figure 4:
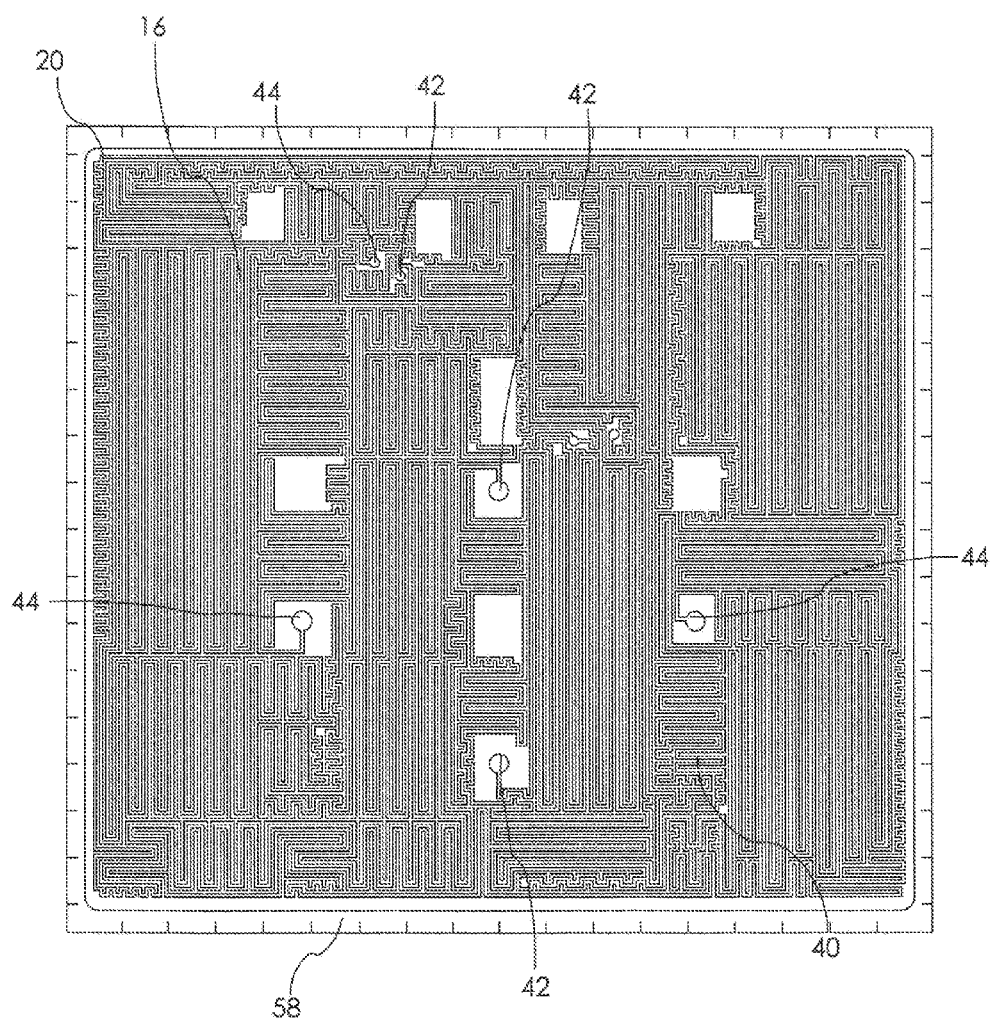
FIG. 4 is a plan view of a security layer of the multi-layered electronic system.

By providing a security track 40 which follows a meandering or tortuous path further safeguards the system 10, since someone wishing to tamper with the primary circuit 28 cannot drill though a housing of a device using the system 10 safe in the knowledge that they will avoid damaging the security tack 40. A more detailed example of such a security track 40 is shown in FIG. 4. To further protect against this type of tampering, the specific form of the security track 40 may be randomised, and/or may be zigzagged, serpentine or spiral, for example.

The security layer 16 and therefore the security track 40 may be arranged so as to cover a majority of a lower surface 58 of the flexible cover layer 20. This adds an extra layer of protection to the system 10, as there will be no avenues through which a tamperer could bypass the security track 40.

A typical security layer 16 may include a plurality of conductive security tracks 20, as shown in FIG. 4, which may be electrically independent of each other. This allows for separate primary circuits 28 having different functions to be integrated into a device, each having separate disconnect functionality.

The form of the electrically-conductive engagement element 18 can be varied, provided that it maintains a secure physical and electrical connection between the security track 40 and the primary conductive track 22. There are therefore several possible embodiments of the electrically-conductive engagement elements 18 that could be conceived.

Although a resistor 30 is suggested, my suitable electrical component or device can be utilised, such as a diode or capacitor, especially those of the surface mount type. However, a resistor is particularly beneficial due to its size and integrated conductive connecting arms.

Figure 3B:
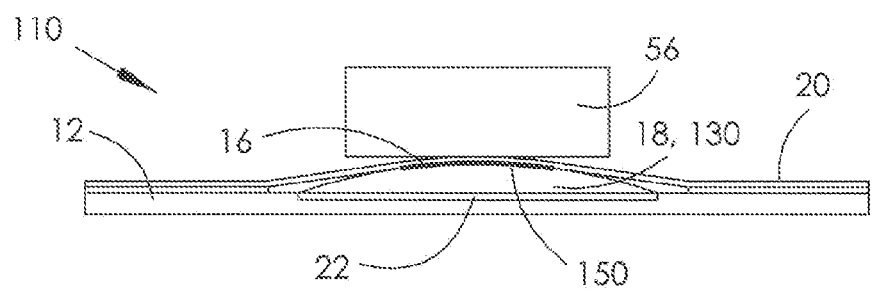
FIG. 3b is a side cross-sectional view of a second embodiment of the present invention.

A second embodiment of the electronic system 110 is shown in FIG. 3b, wherein the electrically-conductive engagement element 18 is provided as a solder bump 130 in lieu of a resistor 30. In this embodiment a piece of solder will be melted onto the primary conductive track 22 forming the solder bump 130, and a upper domed edge 150 of the bump 130 will contact with the security layer 16.

Figure 3C:
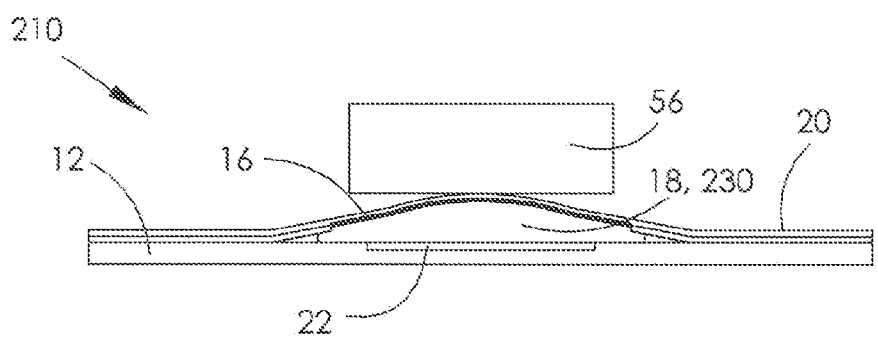
FIG. 3c is a side cross-sectional view of a third embodiment of the present invention.

Alternatively, and as shown in FIG. 3c as a third embodiment of the electronic system 210, the electrically-conductive engagement element 18 could be formed from an electrically-conductive foam 230 or other semi-rigid material. The foam 230 could be imbued with greater electrical conductivity by impregnating it with silver strands, for instance. It will be appreciated that whilst this particular embodiment discloses a deformable material as the electrically-conductive engagement element 18, it will still provide some tension to the flexible cover layer 20 to aid with retention of the security layer 16, and furthermore may be sticky or tacky to partially adhere the security layer 16 and/or flexible cover layer 20 to the foam 230.

Figure 3D:
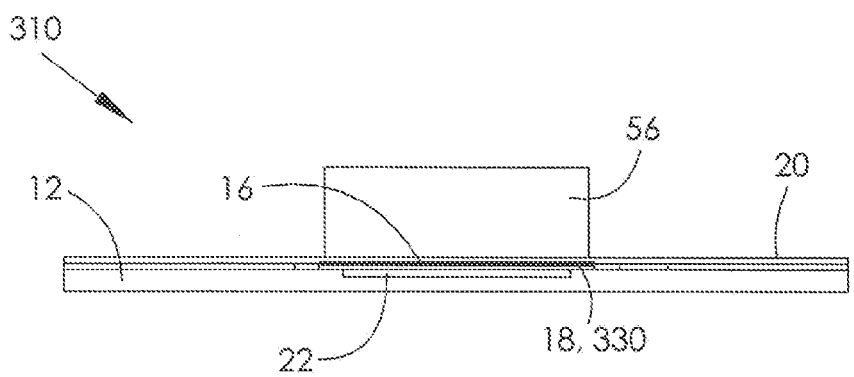
FIG. 3d is a side cross-sectional view of a fourth embodiment of the present invention.

A fourth embodiment of the electronic system 310 is shown in FIG. 3d, wherein the electrically-conductive engagement element 18 is an electrically-conductive adhesive 330, separate from the cover attachment adhesive 54 connecting the flexible cover layer 20 to the PCB 14. In this embodiment, the connectivity between the security layer 16 and the electrically-conductive engagement element 18 is provided by the adhesion via the conductive adhesive 330, rather than being tensioned by the electrically-conductive engagement element 18.

It will be appreciated that whilst the support substrate is described as a PCB, many type of substrate having such a security circuit and electrically-conductive engagement element could be utilised. For instance, a flexible circuit board could be used, provided that the conductive primary track did not become too fragile.

Whilst the flexible cover layer is described as being adhered to the support substrate above, it will be understood that this is not the only means of connection possible between the two. For instance, the flexible cover layer may be indirectly attached to the support substrate by some form of fastener, intermediate engagement device or intermediate layer.

Furthermore, the security layer does not necessarily have to be integral with the flexible cover layer. This merely represents one straightforward way of connecting both the flexible cover layer and the security layer to the support substrate, but is by no means the only way. For instance, individual security layers could be provided for each electrical-conductive engagement element in the electronic system, which are individual retained by a single all-compassing flexible cover layer.

It is therefore possible to provide a multi-layered electronic system for preventing tampering with an electronic device, the system comprising a primary circuit affixed to a support substrate, a security circuit attached to a support layer, an electrically-conductive engagement element interconnecting the two circuits, thereby forming a permanent electrical connection between the circuits, and a flexible cover layer secured to the support substrate to retain the support layer in position. When the security circuit is broken, due to tampering with the device, the primary circuit is deactivated.

The words 'comprise/comprising' and the words 'having/including' when used herein with reference to the present invention are used to specify the presence of stated features, integers, steps or components, but do not preclude the presence or addition of one or more other features, integers, steps, components or groups thereof.

It is appreciated that certain features of the invention, which are, for clarity, described in the context of separate embodiments, may also be provided in combination in a single embodiment. Conversely, various features of the invention which are, for brevity, described in the contact of a single embodiment, may also be provided separately or in any suitable su-combination.

The embodiments described above are provided by way of example only, and various other modifications will be apparent to persons skilled in the field without departing from the scope of the invention as defined herein.

The invention claimed is:

1. A multi-layered anti-tamper electronic system comprising:
   a support substrate including at least a primary conductive track;
   a security layer including at least a conductive security track;
   an electrically-conductive engagement element in electrical communication with the primary conductive track, and to which the security layer is mounted so that the conductive security track is in permanent electrical communication with the primary conductive track through the electrically-conductive engagement element; and
   a flexible cover layer which overlies the security layer and which is directly or indirectly secured to the support substrate;
   wherein the electrical connection between the security layer, conductive engagement element and primary conductive track is interrupted when the conductive security track is broken; and
   wherein the primary conductive track includes first and second primary terminals, the conductive security track includes first and second security terminals, the conductive engagement element being mounted between the first primary terminal and the first security terminal and a further conductive engagement element being mounted between the second primary terminal and the second security terminal, the primary conductive track and security track forming a complete circuit.

2. The system of claim 1, wherein the conductive engagement element is formed from a non-deformable material, thereby providing a tension to the flexible cover layer for compressively retaining the security layer against the conductive engagement element.

3. The system of claim 1, wherein the conductive engagement element is an electrical component secured to the support substrate.

4. The system of claim 3, wherein the electrical component is a resistor, capacitor or diode.

5. The system of claim 1, wherein the conductive engagement element is a solder bump.

6. The system of claim 1, wherein the conductive engagement element is formed from an electrically-conductive foam.

7. The system of claim 1, wherein the conductive engagement element is an electrically-conductive adhesive.

8. The system of claim 1, wherein the conductive security track follows a meandering, tortuous, serpentine or zig-zagged path.

9. The system of claim 8, wherein the conductive security track covers a majority of a lower surface of the flexible cover layer.

10. The system of claim 1, wherein the security layer is integrally formed with the flexible cover layer.

11. The system of claim 1, wherein the support substrate is a printed circuit board.

12. The system of claim 1, wherein the flexible cover layer is directly secured to the support substrate using an adhesive.

13. The system of claim 1, wherein the primary conductive track is formed from copper.

14. The system of claim 1, wherein the conductive security track is formed from copper or silver.

15. The system of claim 1, further comprising a retaining element overlying the flexible cover layer directly above the conductive engagement element, the retaining element applying a retaining force towards the support substrate to reinforce the physical and electrical connection between the security layer, the conductive engagement element and the support substrate.

16. The system of claim 15, wherein the retaining element is a spigot.

17. An anti-tamper electronic device, wherein the circuitry of the device includes the multi-layered anti-tamper electronic system of claim 1.

18. The anti-tamper electronic device of claim 17, wherein at least the flexible cover layer is connected to a case or housing of the electronic device.

19. A method of deactivating the anti-tamper electronic device of claim 17, comprising the steps of: a] tampering with a case or housing of the device; and b] resultantly damaging the flexible cover layer of the multi-layer electronic system due to the tampering, thereby breaking the conductive security track and therefore electronic circuit, deactivating the device.

20. The anti-tamper electronic device of claim 17, wherein the electrically-conductive engagement element is disposed between the conductive security track and the primary conductive track.

21. The system of claim 1, wherein the electrically-conductive engagement element is disposed between the conductive security track and the primary conductive track.

* * * * *